United States Patent
Amoah-Kusi (10) Patent No.: US 9,763,364 B1
(45) Date of Patent: Sep. 12, 2017

(54) HEAT TRANSFER LIQUID FLOW METHOD AND APPARATUS

(71) Applicant: Intel Corporation, Santa Clara, CA (US)

(72) Inventor: Christian Amoah-Kusi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/197,535

(22) Filed: Jun. 29, 2016

(51) Int. Cl.
   *H01F 7/00* (2006.01)
   *H01F 1/00* (2006.01)
   *H05K 7/20* (2006.01)
   *F28F 13/08* (2006.01)

(52) U.S. Cl.
   CPC ......... *H05K 7/20772* (2013.01); *F28F 13/08* (2013.01); *H05K 7/20254* (2013.01); *H05K 7/20281* (2013.01)

(58) Field of Classification Search
   CPC  F25B 21/00; H05K 7/20772; H05K 7/20254; H05K 7/20281; F28F 13/08
   See application file for complete search history.

(56) References Cited

U.S. PATENT DOCUMENTS

| | | | |
|---|---|---|---|
| 2012/0023969 A1* | 2/2012 | Subramaniam | F25B 21/00 62/3.1 |
| 2016/0005524 A1* | 1/2016 | Downing | H01F 27/18 336/61 |
| 2016/0216043 A1* | 7/2016 | Gomez | F28D 15/06 |
| 2016/0377328 A1* | 12/2016 | Hurbi | F25B 21/00 62/3.1 |
| 2017/0030611 A1* | 2/2017 | Radcliff | F25B 9/145 |

* cited by examiner

*Primary Examiner* — Bernard Rojas
(74) *Attorney, Agent, or Firm* — Schwabe, Williamson & Wyatt, P.C.

(57) ABSTRACT

Apparatus and method to facilitate heat transfer fluid flow are disclosed herein. A flexible tube having first and second ends facilitates a heat transfer fluid to flow from the first end to the second end. Ferromagnetic material encircles at least an outside portion of a length of the flexible tube, and a plurality of coil windings encircles the ferromagnetic material. The flexible tube is to be compressed to reduce an amount of flow of the heat transfer fluid from the first end to the second end by expansion of the ferromagnetic material around the flexible tube, in response to an application of a current to the plurality of coil windings.

28 Claims, 6 Drawing Sheets

# HEAT TRANSFER LIQUID FLOW METHOD AND APPARATUS

FIELD OF THE INVENTION

The present disclosure relates generally to the technical field of computing, and more particularly, to heat transfer liquid flow method and apparatus to facilitate temperature control of computer systems and/or computer system components.

BACKGROUND

The background description provided herein is for the purpose of generally presenting the context of the disclosure. Unless otherwise indicated herein, the materials described in this section are not prior art to the claims in this application and are not admitted to be prior art or suggestions of the prior art, by inclusion in this section.

As servers, computing systems, computing units, server farms, data centers, and the like (collectively referred to as "computer systems") increase in complexity and computational capabilities, while in some cases, simultaneously decreasing in size over time, heat generation during operation may pose an ever increasing problem. As the temperature associated with such systems increases, computer systems may experience performance degradation. At high enough temperatures, data loss and/or permanent damage to one or more components of the computer systems may occur.

In recent times, computer systems susceptible to heat generation may be coupled to a cooling system to address the heat generation. For example, a cooling system may circulate a heat transfer fluid in close proximity to the computer system in order to dissipate heat generated by the computer system. Conventional cooling systems tend to regulate the amount of flow of the heat transfer fluid to the computer system on a computer system level basis. Hence, even if only a particular component within the computer system is heating up, increased cooling of the computer system as a whole may occur because the flow rate of the heat transfer fluid may be increased only at a system wide level. Moreover, conventional valves included in cooling systems include a number of structures within the area where the heat transfer fluid may flow, thereby serving as obstructions to the fluid flow path and to cause undesirable pressure drops across the valves.

BRIEF DESCRIPTION OF THE DRAWINGS

Embodiments will be readily understood by the following detailed description in conjunction with the accompanying drawings. The concepts described herein are illustrated by way of example and not by way of limitation in the accompanying figures. For simplicity and clarity of illustration, elements illustrated in the figures are not necessarily drawn to scale. Where considered appropriate, like reference labels designate corresponding or analogous elements.

DETAILED DESCRIPTION

Embodiments of apparatuses and methods related to liquid cooling of computer systems and/or computer system components are described. In embodiments, an apparatus may include a flexible tube having first and second ends to facilitate a heat transfer fluid to flow from the first end to the second end; ferromagnetic material encircling at least an outside portion of a length of the flexible tube; and a plurality of coil windings encircling the ferromagnetic material. The flexible tube may be caused to be compressed to reduce an amount of flow of the heat transfer fluid from the first end to the second end by expansion of the ferromagnetic material around the flexible tube, in response to an application of a current to the plurality of coil windings. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

Figure 1:
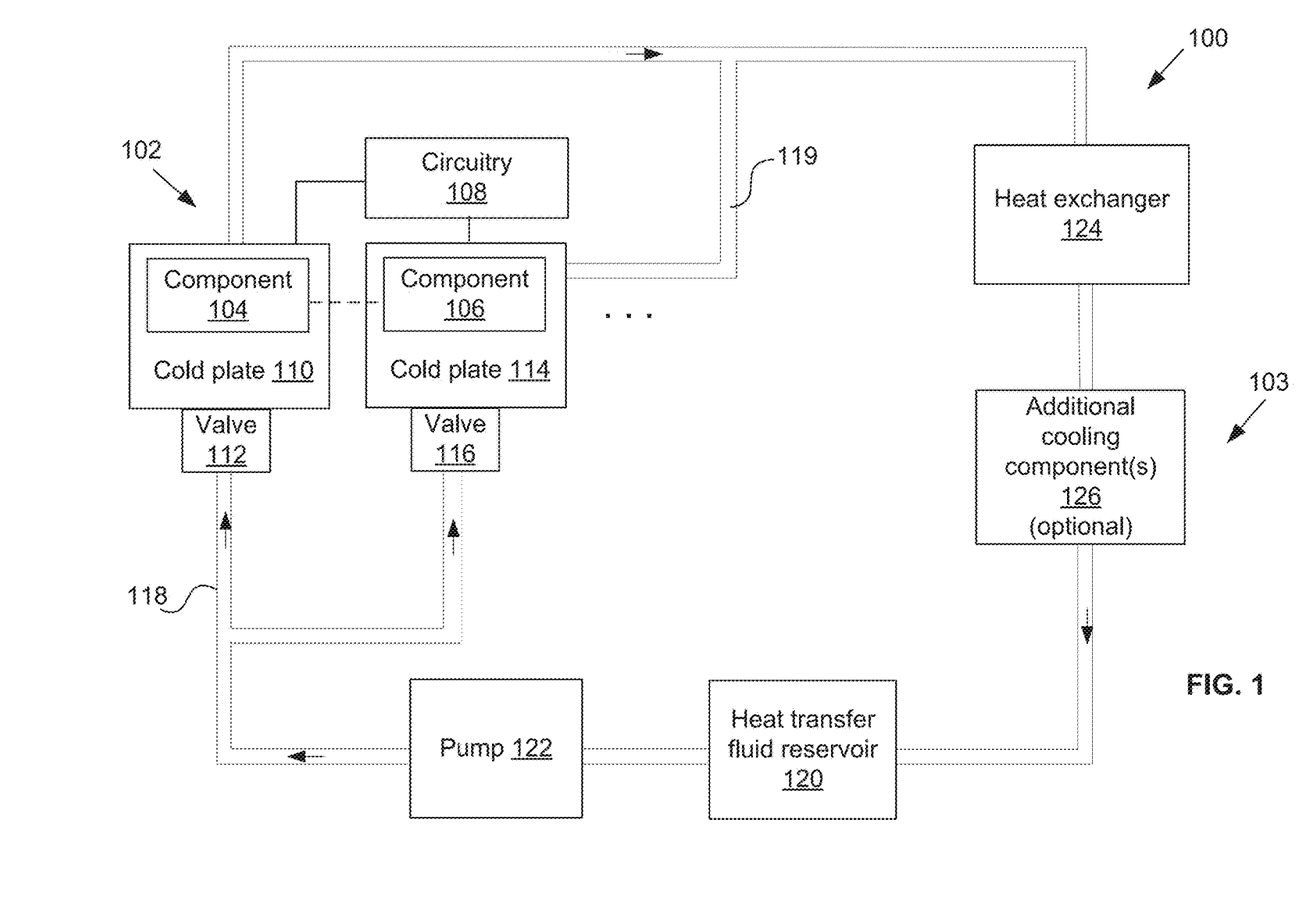
FIG. 1 depicts a block diagram illustrating an example apparatus incorporating aspects of the present disclosure, according to some embodiments.

FIG. 1 depicts a block diagram illustrating an example apparatus 100 incorporating aspects of the present disclosure, according to some embodiments. Apparatus 100 may include a computer system 102 and a cooling system 103. One or more variable valves included in apparatus 100 may include a flexible tube that may be variably compressible via application of specific current to provide a closed position and a plurality of open positions. The amount of heat transfer fluid that may flow through the flexible tube may thus be regulated in accordance with cooling requirements of the computer system 102.

Computer system 102 may comprise, without limitation, one or more servers, computing systems, computing units, server farms, data centers, computing components (e.g., processors, memories, central processing units (CPUs), etc.), component cabinets, and the like. In some embodiments, computer system 102 may also include one or more circuitry or component 108 configured to coordinate and/or facilitate operation of the cooling system 103 with the computer system 102, as described in greater detail below.

Cooling system 103 may comprise a liquid cooling system configured to cool at least a part of the computer system 102. In some embodiments, cooling system 103 may include, without limitation, one or more cold plates (e.g., cold plate 110, cold plate 114), valves (e.g., valve 112, valve 116), heat transfer liquid reservoir 120, pump 122, heat exchanger 124, additional cooling component(s) 126, fluid pathways or loops (e.g., fluid pathway 118, fluid pathway 119), and thermocouples or temperature sensors (not shown).

In some embodiments, each portion of the computer system 102 to be temperature-maintained, cooled, or heat-dissipated may be associated with one or more cold plates. Cold plates, also referred to as cooling plates, cooling blades, or blades, may comprise metal sheets, such as of aluminum or aluminum casting, embedded with tubing, within which a heat transfer liquid may flow through to carry away heat generated by the associated portion of the computer system 102. Alternatively, the one or more cold plates may comprise a variety of heat conductive material in direct contact with tubing through which the heat transfer fluid may traverse. Each portion of the computer system 102 to be cooled may be in direct contact with or coupled to its associated cold plate(s) to facilitate heat transfer from the computer system portion to the cold plate(s).

For example, as shown in FIG. 1, component 104 of the computer system 102 may be coupled to the cold plate 110 to be cooled by the cold plate 110, and component 106 of the computer system 102 may be coupled to the cold plate 114 to be cooled by the cold plate 114. Components 104 and 106 may comprise, for example, processors, memories, integrated circuit (IC) chips, motherboards, circuitry, computer units, or the like. Components 104, 106 may also include circuitry to facilitate operation and/or detection of respective valves 112, 116. In some embodiments, components 104 and 106 may be electrically coupled to each other and/or be in physical proximity to each other; nevertheless, be cooled by different cooling plates from each other.

In some embodiments, each of the cold plates 110 or 114 may comprise one, two, or more cold plates adjacent to respective components 104 or 106. Each of the cold plates 110, 114 may include one or more electrical and/or mechanical components (not shown) such as, but not limited to, one or more thermocouples (or temperature sensors) to detect a temperature associated with respective component 104, 106; electrical coupling mechanisms to electrically couple to the circuitry 108; valve detection mechanisms to detect the presence or absence of respective valve 112, 116; power/current regulator or controller; power source; controller circuitry; current sensing circuitry; in-line current for components 104 or 106; and the like to facilitate monitoring of and/or effective cooling of respective component 104, 106. For instance, cold plate 110 may electrically couple to circuitry 108 of the computer system 102 via an electrical coupling mechanism included at a first side of the cold plate 110, and may (physically) couple to valve 112 via a tube or pipe included at a second side of the cold plate 110, in which the second side may be a side opposite to the first side of the cold plate 110.

In some embodiments, circuitry 108 may comprise a controller, a power source, a current regulator or controller, and the like. Circuitry 108 may comprise hardware, firmware, and/or software. For instance, when cold plate 110 electrically couples to the circuitry 108, circuitry 108 may, among other things, supply power to, control, and/or monitor components associated with the cold plate 110 such as the thermocouple(s) and valve 112. The circuitry 108 may determine the current temperature associated with the component 104 via the thermocouple associated with the cold plate 110, and in response (e.g., if the current temperature is higher than a pre-determined threshold or higher than a previous temperature associated with the component 104), the circuitry 108 may apply a particular current to the valve 112, causing valve 112 to open by a particular amount and thus regulate the amount of heat transfer fluid to the cold plate 110 and component 104. Circuitry 108 may perform similar functionalities for each one of the plurality of cold plates included in apparatus 100. Alternatively, component 104 may be configured to power and provide selective current to valve 112. Actuating valve 112 using component 104 may provide power savings and/or less circuitry requirements.

For ease of illustration, a single valve is illustrated as associated with a particular cold plate in FIG. 1. However, each of cold plates 110, 114 may be associated with one, two, or more valves, in some embodiments. Each valve may be uniquely identifiable and/or known to be associated with a particular cold plate. Valve 112, for instance, may be known to be associated with cold plate 110. In some embodiments, valve 112 may also be referred to as a coupler, a fluid coupler, a variable valve, a variable magnetic valve, a fluid valve, and the like. Valve 112 may include a flexible tube having a first end and a second end opposite the first end. The first end of the flexible tube may couple to a manifold, pipe, or a portion of the cooling system 103 from which heat transfer fluid may be provided. The second end of the flexible tube may couple to a tube, pipe, or portion of the cold plate 110 from which the heat transfer fluid may be received from the valve 112. With both the first and second ends respectively coupled, a fluid pathway 118 may be established for the heat transfer fluid to circulate through the cool plate 110 and cool the component 104 as appropriate.

Conversely, when valve 112 may be in a closed state or decoupled at either its first or second end, fluid pathway 118 may be interrupted and heat transfer fluid may not flow to cold plate 110. In some embodiments, valve 116 may be similar to valve 112 except valve 116 may be associated with cold plate 114, component 106, and/or fluid pathway 119.

Details pertaining to valve 112 are discussed below in conjunction with FIGS. 3A-3C and 4.

In some embodiments, heat transfer fluid (also referred to as a heat transfer liquid or coolant) may be stored in the heat transfer fluid reservoir 120, at a temperature suitable to be provided to the cold plate 110. Heat transfer fluid may comprise water, a refrigerant, a low boiling point solvent, or the like. Pump 122 may be configured to pump the heat transfer fluid out of the heat transfer fluid reservoir 120 and cause the heat transfer fluid to flow within the fluid pathway 118. With valve 112 configured in a particular open state, from among a plurality open states, heat transfer fluid may flow from a manifold or pipe of the cooling system 103 into the first end of the flexible tube included in valve 112; through the flexible tube; exit the valve 112 via the second end of the flexible tube; traverse cold plate 110 (and cool component 104); and then travel to one or more other manifolds or pipes to the heat exchanger 124.

The heat transfer fluid exiting the cold plate 110 and subsequently entering the heat exchanger 124 may be at a higher temperature than the heat transfer fluid entering cold plate 110. In some embodiments, as the heat transfer fluid passes through the cold plate 110, (convective) heat transfer may occur to cause heat generated by the component 104 to transfer to, dissipate from, absorbed by, and/or to be carried away by the heat transfer fluid flowing through the cold plate 110. Consequently, the heat transfer fluid entering the heat exchanger 124 may be at a higher temperature than desirous for cooling purposes. Heat exchanger 124 may be configured to remove at least a portion of the heat absorbed by the heat transfer fluid in order to reduce the temperature associated with the heat transfer fluid to be returned to the heat transfer fluid reservoir 120. For example, heat exchanger 124 may comprise a radiator.

In some embodiments, additional cooling component(s) 126 may be included between the heat exchanger 124 and the heat transfer fluid reservoir 120 to further reduce the temperature associated with the heat transfer fluid to be returned to the heat transfer fluid reservoir 120. Additional cooling component(s) 126 may comprise, without limitation, fans, chillers, coolers, and the like. In alternative embodiments, additional cooling component(s) 126 may be optional if the heat exchanger 124 may be sufficient to perform cooling of the heat transfer fluid exiting the cold plate 110.

Fluid pathway 119 may be associated with valve 116, cold plate 114, and component 106 to similarly cool component 106 as discussed above for component 104.

The relationship between a valve, cold plate, component, fluid pathway, pump, and/or manifold may differ from that shown in FIG. 1. For example, a cold plate may have a unique fluid pathway or share a common fluid pathway with one or more other cold plates; a cabinet may include one or more unique fluid pathways; each valve (e.g., valve 112, valve 116) may be associated with a dedicated pump or may share a common pump; a cold plate may have both a unique fluid pathway and a common fluid pathway with one or more other cold plates; a valve may be implemented on a component-to-be-cooled level, a cold plate level, a manifold level, a cabinet level, and the like. The manner by which the heat transfer fluid may be provided to the valve 112 or valve 116 may vary and not limited by the configuration shown in FIG. 1, which is for ease of illustration only.

Figure 2:
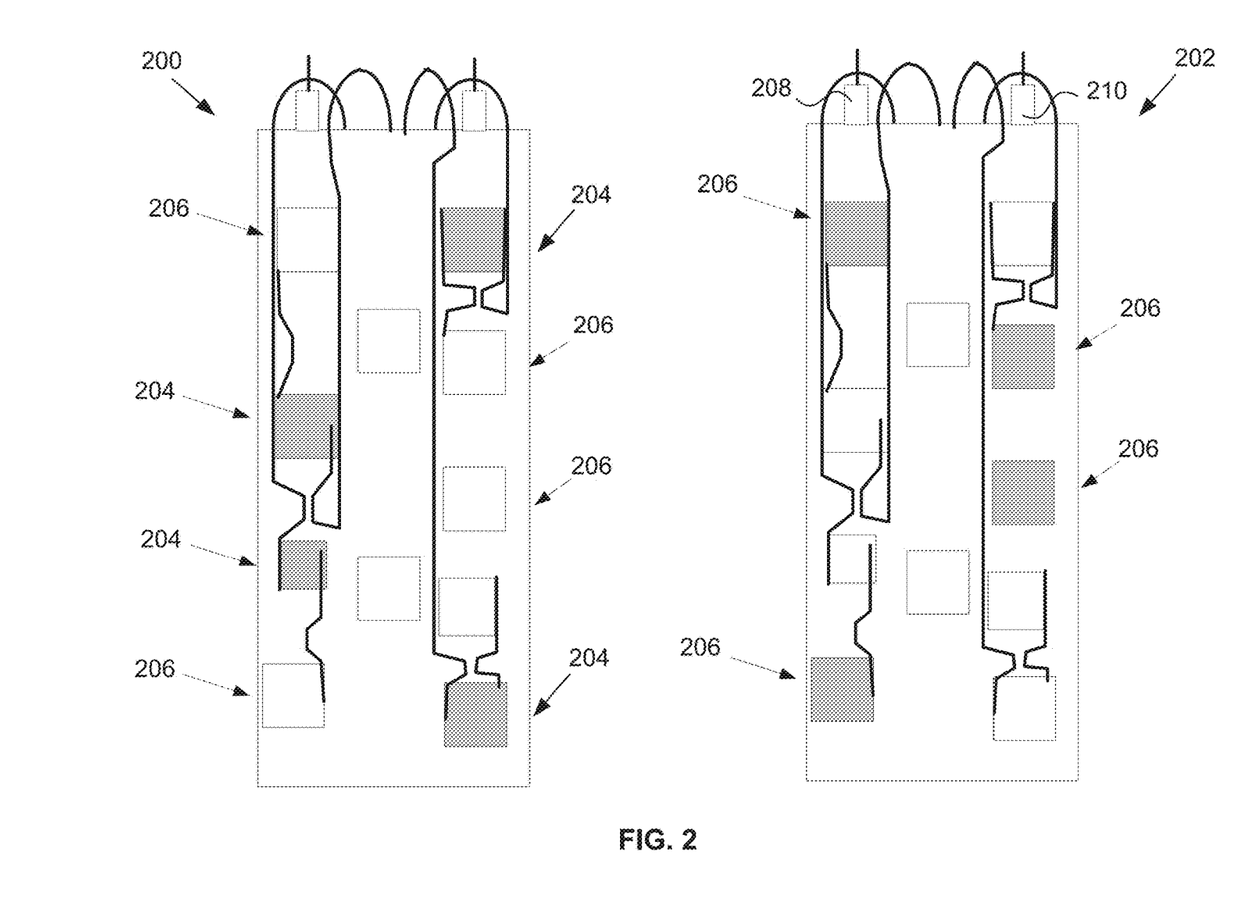
FIG. 2 depicts a top view of example cold plates and associated plurality of components included in a computer system of FIG. 1, according to some embodiments.

For instance, FIG. 2 depicts a top view of example cold plates 200 and 202 and associated plurality of components included in a computer system (e.g., computer system 102), according to some embodiments. Cold plate 200 may be associated with a plurality of different fluid pathways, to provide selective cooling of particular components from among the plurality of components. As shown for cold plate 200, at least four components (components 204) may currently be cooled by flowing heat transfer fluid adjacent to them while at least four other components (components 206) may be hotter than the system would prefer. Components 206 may not currently be cooled or may be receiving heat transfer fluid in an amount less than needed to sufficient cool those components. In response, valves 208, 210 may be adjusted in accordance with the respective applied current to direct a particular amount of heat transfer fluid to components requiring (more) cooling (e.g., components 206). As shown in cold plate 202, which may be identical to cold plate 200 except different fluid pathways and components being cooled are highlighted, components 206 instead of components 204 may now be cooled via flow of heat transfer fluid to components 206 under the control of valves 208, 210.

Figure 3A:
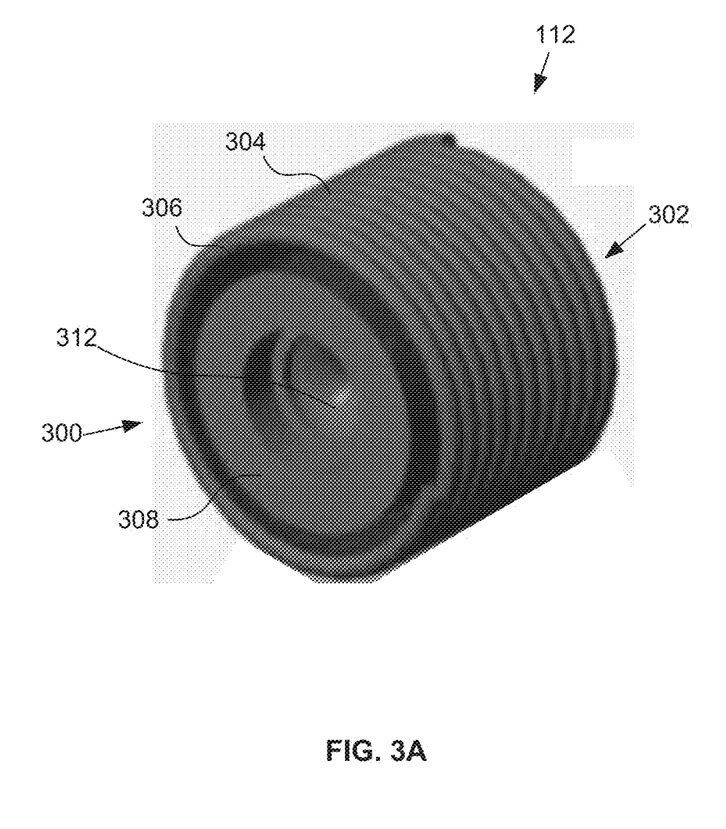
FIGS. 3A-3C depict example illustrations of a valve included in the apparatus of FIG. 1, according to some embodiments.
Figure 3B:
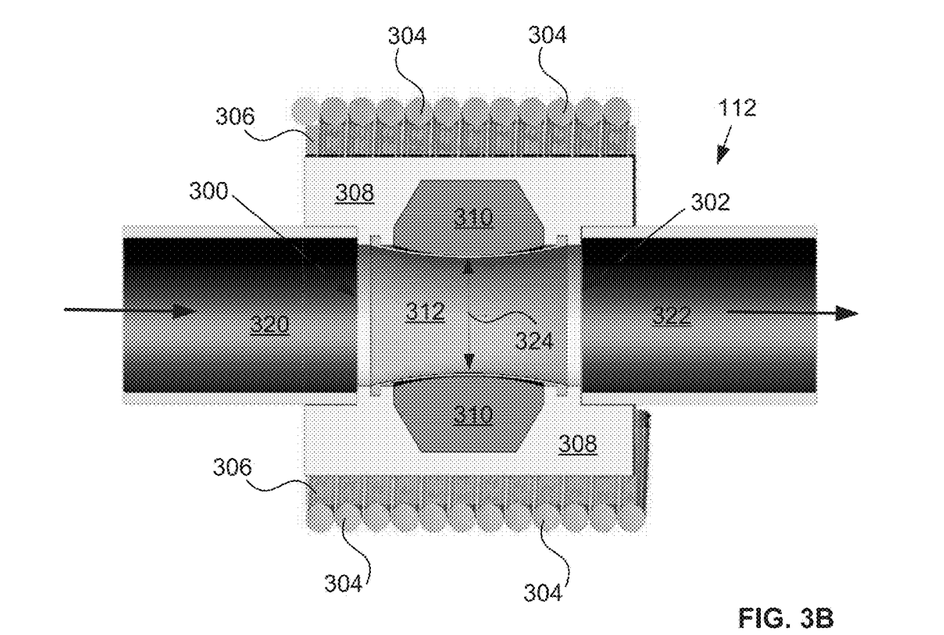
Figure 3C:
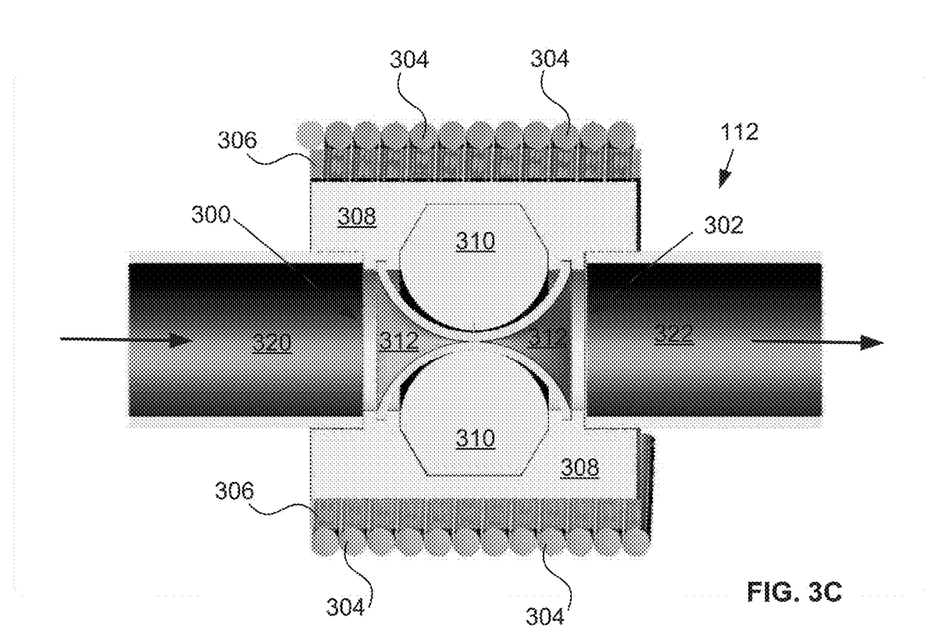

FIGS. 3A-3C depict example illustrations of a valve included in apparatus 100 (e.g., valve 112), according to some embodiments. FIG. 3A depicts an example perspective view of the valve 112, and FIGS. 3B-3C depict cross-sectional views of the valve 112 at two different states. In some embodiments, valve 112 may include a plurality of coil windings 304, a magnetic ring 306, a coupling mechanism 308, a ferromagnetic material 310, and a flexible tube 312.

In some embodiments, the ferromagnetic material 310 may encircle at least an outside portion of a length of the flexible tube 312. The plurality of coil windings 304 may encircle the ferromagnetic material 310, extend the length of the valve 112, and may comprise the outermost layer of the valve 112 (see FIG. 3A). Magnetic ring 306 may encircle the ferromagnetic material 310 and may be disposed between the ferromagnetic material 310 and the plurality of coil windings 304. The coupling mechanism 308 may be concentric with the magnetic ring 306 and may be disposed within the same "layers" as the ferromagnetic material 310 and flexible tube 312. In some embodiments, a protective or insulative outermost layer (not shown) may encircle the plurality of coil windings 304.

The flexible tube 312 may have a first end 300 and a second end 302 on an opposite side of the first end 300. As shown in FIGS. 3B-3C, the first end 300 may couple to a first tube or pipe 320, such as a manifold included in the cooling system 103, from which the heat transfer fluid may be provided to the valve 112; and the second end 302 may couple to a second tube or pipe 322, such as a tube or pipe included in the cold plate 110, which may be configured to receive heat transfer fluid exiting the valve 112.

In some embodiments, the plurality of coil windings 304 may comprise a conductive or metallic material configured for an applied current to flow from one end to the opposite end. The magnetic ring 306 may comprise a ferrite magnetic material capable of generating a magnetic field in accordance with the current flowing through the plurality of coil windings 304. The coupling mechanism 308 may comprise a plastic or metallic material configured to receive and couple to the first and second tubes or pipes 320, 322. Coupling mechanism 308 may couple or connect to the first and second tubes or pipes 320, 322 via a friction fit, threaded fit, or the like. When the first and second tubes or pipes 320, 322 are secured to the coupling mechanism 308, the heat transfer fluid may flow through the valve 112 (assuming the flexible tube 312 may be in an open position). In some embodiments, when the coupling mechanism 308 may be connected to at least the second tube or pipe 322 (associated with the cold plate 110), an electrical coupling may also be established between the valve 112 and the cold plate 110 so that current may be selectively applied to the plurality of coil windings 304.

The ferromagnetic material 310 may comprise a plurality of ferromagnetic particles suspended in a liquid, and may be encased in a flexible casing, bladder, or sack, such as made of rubber material. As the volume associated with the ferromagnetic material 310 changes (e.g., volumetrically changes by increasing/expanding or decreasing/contracting/unexpanding in response to an induced magnetic field), the surrounding flexible casing may similarly expand or contract/unexpand. In alternative embodiments, ferromagnetic material 310 may comprise an electro active polymer (EAP) material that includes a plurality of ferromagnetic particles embedded in a polymer material. In some embodiments, the ferromagnetic material 310 (and its flexible casing) may comprise a polyhedral torus shape. Ferromagnetic material 310 may also be referred to as an annular ring or expandable annular ring.

The flexible tube 312 may comprise a rubber material that is flexible or compressible in at least a direction approximately perpendicular to the longitudinal direction of the flexible tube 312. In some embodiments, an inner diameter or opening 324 of the flexible tube 312 may change based on the amount of compression of the flexible tube 312 caused by the ferromagnetic material 310. The flexible tube 312 is shown in a fully open state or position in FIG. 3B, in which the maximum amount of heat transfer fluid may flow through the flexible tube 312. In FIG. 3C, flexible tube 312 is shown in a fully closed state or position, and the heat transfer fluid may not flow through the flexible tube 312. Flexible tube 312 may also be configured to be in any one of a plurality of states or positions between the fully open and closed states or position (e.g., inner diameter 324 may set to any value smaller than illustrated in FIG. 3B) by application of any one of a particular current from among a plurality of current values to the plurality of coil windings 304.

In some embodiments, valve 112 may be cylindrical in overall shape with an indentation or cutout at each end sized and shaped (e.g., the coupling mechanism 308) to receive and couple with the first and second tubes or pipes 320, 322. The dimensions of the valve 112 may be tailored to conform with the dimensional requirements of the cooling system 103, such as the diameters of the first and second tubes or pipes 320, 322, and computer system 102, such as to fit within available spacing proximate the cool plates and/or components. For instance, the overall or outer diameter of the valve 112 may be approximately one inch and the inner diameter associated with the coupling mechanism 308 may be approximately 0.25 inch. As another example, the overall or outer diameter of the valve 112 may be approximately two inches and the inner diameter associated with the coupling mechanism 308 may be approximately 0.5 inch.

Figure 4:
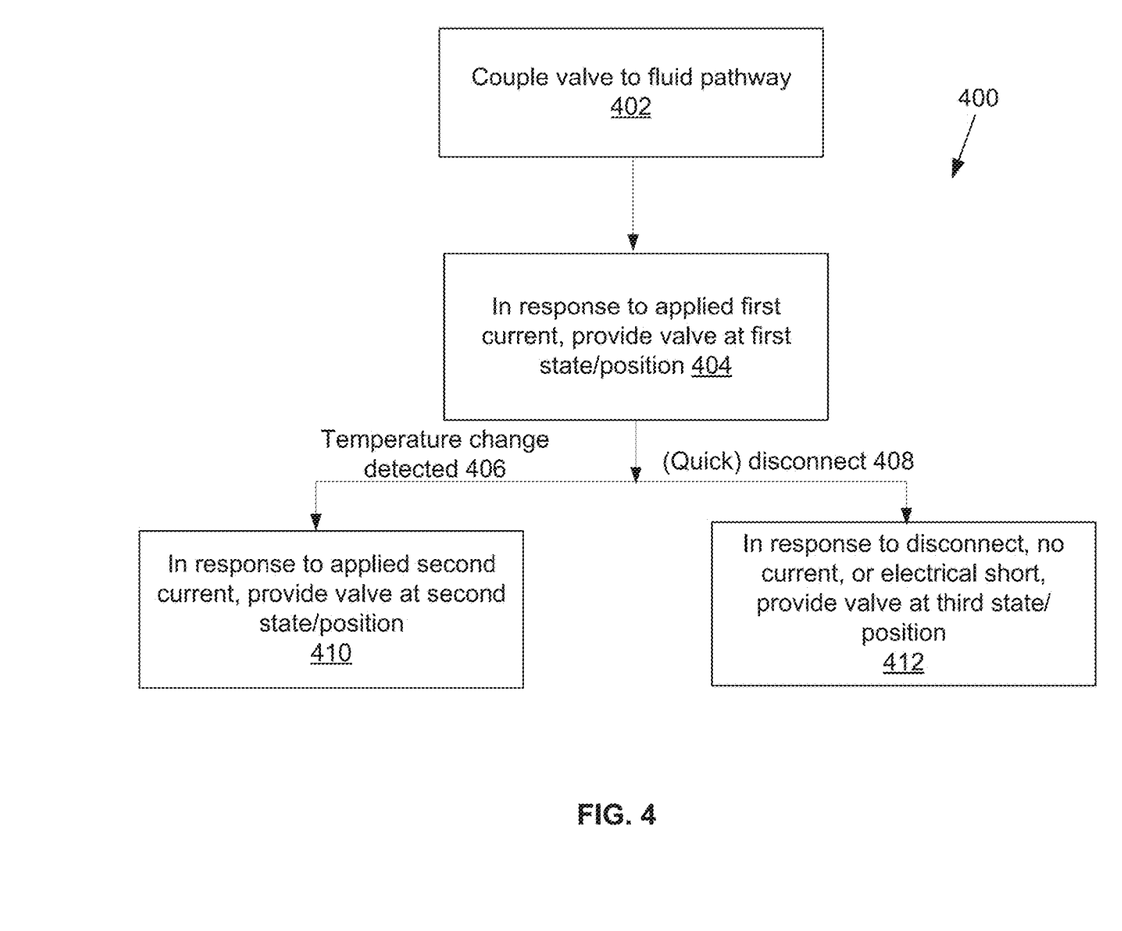
FIG. 4 depicts an example process relating to operation of a valve, according to some embodiments.

FIG. 4 depicts an example process 400 relating to operation of the valve 112, according to some embodiments. At block 402, valve 112 may be implemented within the apparatus 100 upon coupling to the fluid pathway 118. The first end 300 of valve 112 may couple to a manifold included in the cooling system 103 and the second end 302 of valve 112 may couple to the cold plate 110 (or a tube or pipe comprising an inlet to the cold plate 110). The connection of the first end 300 to the manifold may provide access to the heat transfer fluid pumped out by the pump 122. The connection of the second end 302 to the cold plate 110 may provide power to the valve 112, and in particular, permit a particular current to be applied to the plurality of coil windings 304 of valve 112.

In some embodiments, when valve 112 is not coupled to the cold plate 110 (and thus not powered), flexible tube 312 may be at a fully open state or position (e.g., diameter 324 may be at a maximum value such as shown in FIG. 3B). After coupling to the cold plate 110, valve 112 may change from the fully open state to a first state or position in response to a first current applied to the plurality of coil windings 304, at block 404. The first current may comprise a particular current value from among a plurality of current values, in which the plurality of current values may correspond to the flexible tube 312 at any immediate state or position between the fully open state (FIG. 3B) and a fully closed state (FIG. 3C). In some embodiments, the circuitry 108 and/or component 104 may control the current applied to the plurality of coil windings 304. In some embodiments, a particular current applied to the plurality of coil windings 304 may cause the magnetic ring 306 to generate a magnetic field, and the magnetic field, in turn, may induce an expansion in the volume associated with the ferromagnetic material 310. The volume expansion of the ferromagnetic material 310 may cause the flexible tube 312 to be compressed, and in particular, for the diameter 324 or opening of the flexible tube 312 to be reduced. With the flexible tube 312 compressed, the amount of flow of the heat transfer fluid through the valve 112 may be reduced; which reduces the amount of heat transfer fluid to the cold plate 110.

When a change in the temperature associated with the component 104 may be detected (branch 406), or it may be desirous to increase or decrease cooling of component 104, a second current different from the first current may be applied to the plurality of coil windings 304, at block 410. In response, valve 112 may change from the first state or position to a second state or position. In some embodiments, if additional cooling of component 104 is desired (e.g., a temperature increase is detected), then the second current may be less than the first current in order for the ferromagnetic material 310 to decrease or contract in volume relative to the volume associated with the first state/position, thereby permitting the flexible tube 312 to expand or be less compressed than in block 404. With less compression of the flexible tube 312, the amount of heat transfer fluid that may flow through flexible tube 312 may be more than before application of the second current.

Conversely, in some embodiments, if less cooling of component 104 is desired (e.g., a temperature decrease is detected, some of the cooling resources are to be diverted to other component(s) requiring cooling or more cooling), then the second current may be greater than the first current. The ferromagnetic material 310 may expand in volume relative to the volume associated with the first state/position, and the flexible tube 312 may be further compressed relative to the amount of compression associated with the first current. With more compression of the flexible tube 312, the amount of heat transfer fluid that may flow through the flexible tube 312 may be less than before application of the second current.

The current may be subsequently varied as described above to control the amount of heat transfer fluid flowing into the cold plate 110 via the valve 112 over time.

At branch 408 of process 400, in response to a disconnect, quick disconnect (e.g., an accidental disconnect from the flowing heat transfer fluid), no current, and/or electrical short detected by the circuitry 108 and/or component 104, valve 112 may be provided at a third state or position (block 412). In some embodiments, the third state or position may comprise a fully open state or position of the valve 112 (e.g., as shown in FIG. 3B). Without current flowing in the plurality of coil windings 304, ferromagnetic material 310 may be at a minimum volume and the flexible tube 312 may correspondingly not be compressed and thus valve 112 may be fully open.

Figure 5:
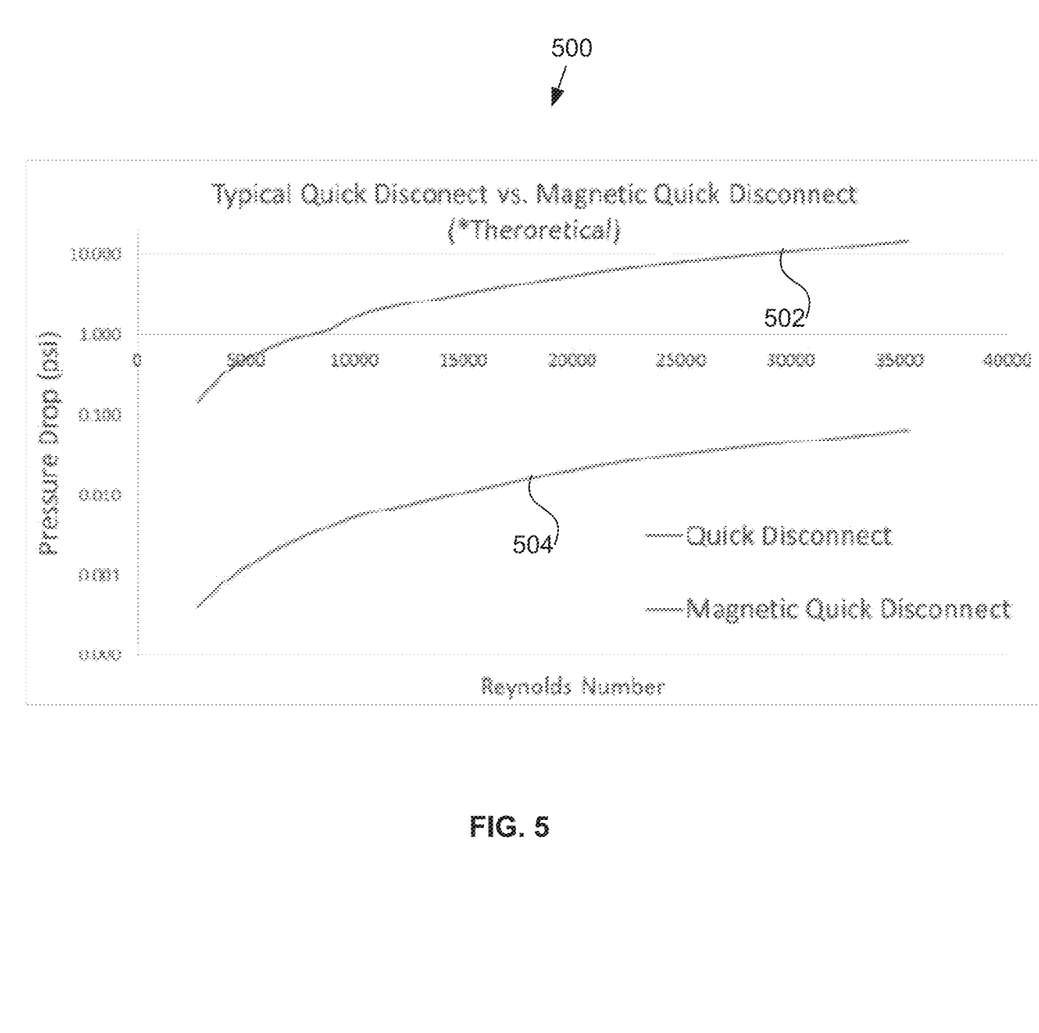
FIG. 5 depicts an example plot illustrating performance of conventional valves to the valve included in FIG. 1, according to some embodiments.

FIG. 5 depicts an example plot 500 illustrating performance of conventional valves to valve 112, according to some embodiments. Line 502 may be associated with conventional valves and line 504 may be associated with the valve 112. As shown in FIG. 5, line 504 has a lower pressure drop across a range of heat transfer fluid flow rates (e.g. horizontal axis) than line 502. The higher the pressure drop, the more that the heat transfer fluid may need to be pumped, which in turn requires more energy, pump(s), and the like.

Valve 112 may provide lower pumping costs because of the absence of obstructions within the flexible tube 312. Among other things, the particular configuration of valve 112 does not require coupling components and/or valve state controller components to be within the flexible tube 312, which is also the same area where the heat transfer fluid flows. In addition, use of valve 112 permits improvements in heat exchanger efficiency by ensuring that the hotter or hottest possible heat transfer fluid returns to the heat exchanger. Rather than cooling at the cabinet level or higher, valve 112 permits cooling control to particular portions of a cabinet or even on per computer component level, constricting flow to parts of the cabinet where cooling may not be needed and opening or increasing flow to parts of the cabinets where (additional) cooling may be beneficial. Hence, the heat transfer fluid returning to the heat exchanger may be at a higher temperature than if the cooling was performed on a cabinet level or higher. Valve 112 provides the ability to selectively distribute cooling fluid to "hot spots."

In some embodiments, valve 112 may provide quick disconnect functionality and facilitate automatic system response to a quick disconnect event. For instance, a cabinet may include eight cold plates, each cold plate associated with one or more computer components. A technician was to pull out or disconnect cold plate #7 from the cabinet. Instead, the technician accidentally pulled out or disconnected cold plate #6, in which cold plate #6 was cooling its associated components just prior to being pulled out. While a thermocouple associated with the components of cold plate #6 may detect a temperature increase and the cabinet circuitry may eventually determine that an overheat condition occurred for components associated with cold plate #6, use of valve 112 as a coupler or conduit between a cold plate and the cooling system provides real-time and automatic detection of a disconnect, even accidental disconnects. In the example above, when cold plate #6 is accidentally disconnected from the cabinet, the valve associated with cold plate #6 may also be uncoupled from the cabinet circuitry. Upon decoupling from the cabinet circuitry, an electrical short may be detected with respect to the valve associated with cold plate #6, and because the cabinet circuity knows which valve is associated with which cold plate, detection of the electrical short to a particular valve also provides automatic detection of a cold plate disconnect. In response, the cabinet circuitry may automatically initiate shutdown of the components associated with the disconnect cold plate (cold plate #6) so as to proactively prevent loss of data and/or permanent damage to those components.

In this manner, valves that may be variably controlled using current and magnetic field to provide an open state, a closed state, and a plurality of states between the open and close states are disclosed herein. Use of a plurality of such valves to cool computer systems permits active cooling of specific portions of the computer systems over time and in response to changing cooling requirements.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Illustrative examples of the devices, systems, and methods of various embodiments disclosed herein are provided below. An embodiment of the devices, systems, and methods may include any one or more, and any combination of, the examples described below.

Example 1 is an apparatus including a flexible tube having first and second ends to facilitate a heat transfer fluid to flow from the first end to the second end; ferromagnetic material encircling at least an outside portion of a length of the flexible tube; and a plurality of coil windings encircling the ferromagnetic material, wherein the flexible tube is to be compressed to reduce an amount of flow of the heat transfer fluid from the first end to the second end by expansion of the ferromagnetic material around the flexible tube, in response to an application of a current to the plurality of coil windings.

Example 2 may include the subject matter of Example 1, and may further include a magnetic ring encircling the ferromagnetic material and disposed between the ferromagnetic material and the plurality of coil windings, wherein the magnetic ring is to generate a magnetic field in response to the application of the current, and the magnetic field is to induce the expansion of the ferromagnetic material.

Example 3 may include the subject matter of any of Examples 1-2, and may further include wherein, the ferromagnetic material is to be unexpanded, in response to an absence of the application of the current to the plurality of coil winding, and the heat transfer fluid is to flow from the first end to the second end of the flexible tube.

Example 4 may include the subject matter of any of Examples 1-3, and may further include wherein, the ferromagnetic material is to be unexpanded, in response to an electrical short to the application of current to the plurality of coil windings, and the heat transfer fluid is to flow from the first end to the second end of the flexible tube.

Example 5 may include the subject matter of any of Examples 1-4, and may further include a flexible casing surrounding the ferromagnetic material, wherein the ferromagnetic material comprises a plurality of ferromagnetic particles suspended in a liquid, and wherein the expansion of the ferromagnetic material comprises an expansion of a volume associated with the ferromagnetic material.

Example 6 may include the subject matter of any of Examples 1-5, and may further include wherein the ferromagnetic material comprises an electro active polymer (EAP) material that includes a plurality of ferromagnetic particles embedded in a polymer material.

Example 7 may include the subject matter of any of Examples 1-6, and may further include wherein the ferromagnetic material is to have a base volume, responsive to an absence of the application of the current to the plurality of coil windings or occurrence of an electrical short at the plurality of coil windings, to cause the flexible tube to be in a fully open position, and the ferromagnetic material is to have a selected one of a plurality of expanded volumes greater than the base volume, responsive to an application of a respective selected one of a plurality of currents to the plurality of coil windings, to cause the flexible tube to be in a respective selected one of a plurality of positions less open than the fully open position.

Example 8 may include the subject matter of any of Examples 1-7, and may further include wherein the current to reduce the amount of flow of the heat transfer fluid from the first end to the second end comprises one of the plurality of currents and comprises a highest current from among the plurality of currents.

Example 9 may include the subject matter of any of Examples 1-8, and may further include wherein the ferromagnetic material is to have a largest expanded volume from among the plurality of expanded volumes, responsive to the application of the current to the plurality of coil windings, to cause the flexible tube to be in a fully closed position from among the plurality of positions.

Example 10 may include the subject matter of any of Examples 1-9, and may further include wherein the apparatus is to be coupled to a liquid cooling system, wherein the first end of the flexible tube is to be coupled to a first tube of the liquid cooling system and the first tube is to provide the heat transfer fluid into the apparatus, and wherein the second end of the flexible tube is to be coupled to a second tube of the liquid cooling system and the second tube is to receive the heat transfer fluid from the apparatus.

Example 11 may include the subject matter of any of Examples 1-10, and may further include wherein the apparatus is to be coupled to a cold plate associated with a component of a computer system, wherein the heat transfer fluid is to flow through the apparatus to cause the cold plate to reduce a temperature associated with the component.

Example 12 may include the subject matter of any of Examples 1-11, and may further include wherein the cold plate comprises a blade or tray that is insertable or detachable from a rack system associated with the compute system.

Example 13 may include the subject matter of any of Examples 1-12, and may further include wherein the heat transfer fluid comprises water, a refrigerant, or a low boiling point solvent.

Example 14 may include the subject matter of any of Examples 1-13, and may further include wherein the flexible tube comprises a rubber material.

Example 15 is a method including, in response to a first current applied to a plurality of coil windings included in a valve, compressing a flexible tube included in the valve to a first state from among a plurality of states using a ring of ferromagnetic material, having a first volume, included in the valve and encircling at least an outside portion of a length of the flexible tube to cause the compression, wherein a first amount of a heat transfer fluid is to flow through the flexible tube in accordance with the first state; and, in response to a second current applied to the plurality of coil windings, compressing the flexible tube to a second state using the ring of ferromagnetic material having a second volume, wherein a second amount of the heat transfer fluid is to flow through the flexible tube in accordance with the second state.

Example 16 may include the subject matter of Example 15, and may further include wherein the first current is a different current than the second current.

Example 17 may include the subject matter of any of Examples 15-16, and may further include wherein compressing the flexible tube using the ring of ferromagnetic material, having the first volume, comprises inducing a first magnetic field in response to the first current applied to the plurality of coil windings; and forming a volume of the ring of ferromagnetic material at the first volume in accordance with the first magnetic field.

Example 18 may include the subject matter of any of Examples 15-17, and may further include wherein when the second current comprises a current less than the first current, the second state associated with the flexible tube comprises a more open state than the first state and the second volume associated with the ring of ferromagnetic material is less than the first volume.

Example 19 may include the subject matter of any of Examples 15-18, and may further include wherein when the second current comprises a current greater than the first current, the second state associated with the flexible tube comprises a less open less state than the first state and the second volume associated with the ring of ferromagnetic material is greater than the first volume.

Example 20 may include the subject matter of any of Examples 15-19, and may further include wherein the second state comprises a fully closed state, and the first state comprises an open state between the fully closed state and a fully open state.

Example 21 may include the subject matter of any of Examples 15-20, and may further include wherein when the second current comprises zero current, the second state associated with the flexible tube comprises a fully open state and the second volume associated with the ring of ferromagnetic material is less than the first volume.

Example 22 may include the subject matter of any of Examples 15-21, and may further include wherein the plurality of states includes a fully open state, a fully closed state, and one or more state between the fully open and fully closed states.

Example 23 may include the subject matter of any of Examples 15-22, and may further include wherein the ring of ferromagnetic material is encased in a flexible casing, and wherein the ring of ferromagnetic material comprises a plurality of ferromagnetic particles suspended in a liquid.

Example 24 may include the subject matter of any of Examples 15-23, and may further include wherein the ring of ferromagnetic material comprises an electro active polymer (EAP) material that includes a plurality of ferromagnetic particles embedded in a polymer material.

Example 25 is an apparatus including a valve that includes a flexible tube having first and second ends to facilitate a heat transfer fluid to flow from the first end to the second end, ferromagnetic material encircling at least an outside portion of a length of the flexible tube, and a plurality of coil windings encircling the ferromagnetic material; a first tube associated with a cooling system coupled to the first end of the flexible tube; a second tube associated with a cold plate coupled to a component of a computer system to be cooled, the second tube coupled to the second end of the flexible tube; and wherein the ferromagnetic material is to have a base volume, responsive to an absence of an application of a current to the plurality of coil windings or occurrence of an electrical short at the plurality of coil windings, to cause the flexible tube to be in a fully open position, and the ferromagnetic material is to have a selected one of a plurality of expanded volumes greater than the base volume, responsive to an application of a respective selected one of a plurality of currents to the plurality of coil windings, to cause the flexible tube to be in a respective selected one of a plurality of positions less open than the fully open position.

Example 26 may include the subject matter of Example 25, and may further include wherein the flexible tube is to be compressed to reduce an amount of flow of the heat transfer fluid from the first end to the second end by expansion of the ferromagnetic material around the flexible tube, in response to the application of the respective selected one of the plurality of currents to the plurality of coil windings.

Example 27 may include the subject matter of any of Examples 25-26, and may further include wherein the ferromagnetic material is to have a largest expanded volume from among the plurality of expanded volumes, responsive to the application of the current to the plurality of coil windings, to cause the flexible tube to be in a fully closed position from among the plurality of positions.

Example 28 may include the subject matter of any of Examples 25-27, and may further include wherein the valve further includes a magnetic ring encircling the ferromagnetic material and disposed between the ferromagnetic material and the plurality of coil windings, wherein the magnetic ring is to generate a magnetic field in response to the application of the respective selected one of a plurality of currents, and the magnetic field is to induce expansion of the ferromagnetic material.

Example 29 may include the subject matter of any of Examples 25-28, and may further include wherein the valve further includes a flexible casing surrounding the ferromagnetic material, wherein the ferromagnetic material comprises a plurality of ferromagnetic particles suspended in a liquid, and wherein expansion of the ferromagnetic material comprises an expansion of a volume associated with the ferromagnetic material.

Example 30 may include the subject matter of any of Examples 25-29, and may further include wherein the ferromagnetic material comprises an electro active polymer (EAP) material that includes a plurality of ferromagnetic particles embedded in a polymer material.

Example 31 may include the subject matter of any of Examples 25-30, and may further include wherein the heat transfer fluid comprises water, a refrigerant, or a low boiling point solvent.

Example 32 may include the subject matter of any of Examples 25-31, and may further include wherein the component of the computer system comprises one or more processors, memories, integrated circuit (IC) chips, motherboards, circuitry, or computer units.

Example 33 is an apparatus including means to facilitate heat transfer fluid flow from a first end to a second end; means for volumetrically changing encircling at least an outside portion of a length of the means to facilitate heat transfer fluid flow; and means for inducing a magnetic field encircling the means for volumetrically changing, wherein the means to facilitate heat transfer fluid flow is to be compressed to reduce an amount of flow of the heat transfer fluid from the first end to the second end by expansion of the means for volumetrically changing around the means to facilitate heat transfer fluid flow, in response to an application of a current to the means for inducing a magnetic field.

Example 34 may include the subject matter of Example 33, and may further include a magnetic means encircling the means for volumetrically changing and disposed between the means for volumetrically changing and the means for inducing the magnetic field, wherein the magnetic means is to generate a magnetic field in response to the application of the current, and the magnetic field is to induce the expansion of the means for volumetrically changing.

Example 35 may include the subject matter of any of Examples 33-34, and may further include wherein, the means for volumetrically changing is to be unexpanded, in response to an absence of the application of the current to the means for inducing the magnetic field, and the heat transfer fluid is to flow from the first end to the second end.

Example 36 may include the subject matter of any of Examples 33-35, and may further include wherein, the means for volumetrically changing is to be unexpanded, in response to an electrical short to the application of current to the means for inducing a magnetic field, and the heat transfer fluid is to flow from the first end to the second end.

Example 37 may include the subject matter of any of Examples 33-36, and may further include a flexible casing surrounding the means for volumetrically changing, wherein the means for volumetrically changing comprises a plurality of ferromagnetic particles suspended in a liquid, and wherein the expansion of the means for volumetrically changing comprises an expansion of a volume associated with the means for volumetrically changing.

Example 38 may include the subject matter of any of Examples 33-37, and may further include wherein the means for volumetrically changing comprises an electro active polymer (EAP) material that includes a plurality of ferromagnetic particles embedded in a polymer material.

Example 39 may include the subject matter of any of Examples 33-38, and may further include wherein the means for volumetrically changing is to have a base volume, responsive to an absence of the application of the current to the means for inducing the magnetic field or occurrence of an electrical short at the means for inducing the magnetic field, to cause the means to facilitate heat transfer fluid flow to be in a fully open position, and the means for volumetrically changing is to have a selected one of a plurality of expanded volumes greater than the base volume, responsive to an application of a respective selected one of a plurality of currents to the means for inducing the magnetic field, to cause the means to facilitate heat transfer fluid flow to be in a respective selected one of a plurality of positions less open than the fully open position.

Example 40 may include the subject matter of any of Examples 33-39, and may further include wherein the current to reduce the amount of flow of the heat transfer fluid from the first end to the second end comprises one of the plurality of currents and comprises a highest current from among the plurality of currents.

Example 41 may include the subject matter of any of Examples 33-40, and may further include wherein the means for volumetrically changing is to have a largest expanded volume from among the plurality of expanded volumes, responsive to the application of the current to the means for inducing the magnetic field, to cause the means to facilitate heat transfer fluid flow to be in a fully closed position from among the plurality of positions.

Example 42 may include the subject matter of any of Examples 33-41, and may further include wherein the apparatus is to be coupled to a liquid cooling system, wherein the first end of the means to facilitate heat transfer fluid flow is to be coupled to a first tube of the liquid cooling system and the first tube is to provide the heat transfer fluid into the apparatus, and wherein the second end of the means to facilitate heat transfer fluid flow is to be coupled to a second tube of the liquid cooling system and the second tube is to receive the heat transfer fluid from the apparatus.

Example 43 may include the subject matter of any of Examples 33-42, and may further include wherein the apparatus is to be coupled to a cold plate associated with a component of a computer system, wherein the heat transfer fluid is to flow through the apparatus to cause the cold plate to reduce a temperature associated with the component.

Example 44 may include the subject matter of any of Examples 33-43, and may further include wherein the cold plate comprises a blade or tray that is insertable or detachable from a rack system associated with the compute system.

Example 45 may include the subject matter of any of Examples 33-44, and may further include wherein the heat transfer fluid comprises water, a refrigerant, or a low boiling point solvent.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

I claim:

1. An apparatus comprising:
    a flexible tube having first and second ends to facilitate a heat transfer fluid to flow from the first end to the second end;
    ferromagnetic material encircling at least an outside portion of a length of the flexible tube; and
    a plurality of coil windings encircling the ferromagnetic material,
        wherein the flexible tube is to be compressed to reduce an amount of flow of the heat transfer fluid from the first end to the second end by expansion of the ferromagnetic material around the flexible tube, in response to an application of a current to the plurality of coil windings.

2. The apparatus of claim 1, further comprising:
    a magnetic ring encircling the ferromagnetic material and disposed between the ferromagnetic material and the plurality of coil windings,
        wherein the magnetic ring is to induce the expansion of the ferromagnetic material in response to the application of the current.

3. The apparatus of claim 1, wherein the ferromagnetic material is to be unexpanded in response to an absence of the application of the current to the plurality of coil windings, and the heat transfer fluid is to flow from the first end to the second end of the flexible tube.

4. The apparatus of claim 1, wherein the ferromagnetic material is to be unexpanded in response to an electrical short of the current, and the heat transfer fluid is to flow from the first end to the second end of the flexible tube.

5. The apparatus of claim 1, wherein the ferromagnetic material is to have a base volume, responsive to an absence of the application of the current to the plurality of coil windings or occurrence of an electrical short at the plurality of coil windings, to cause the flexible tube to be in a fully open position, and the ferromagnetic material is to have a selected one of a plurality of expanded volumes greater than the base volume, responsive to an application of a respective selected one of a plurality of currents to the plurality of coil windings, to cause the flexible tube to be in a respective selected one of a plurality of positions less open than the fully open position.

6. The apparatus of claim 5, wherein the application of the current to the plurality of coil windings includes application of a highest current from among the plurality of currents.

7. The apparatus of claim 6, wherein the ferromagnetic material is to have a largest expanded volume from among the plurality of expanded volumes, responsive to the application of the current to the plurality of coil windings, to cause the flexible tube to be in a fully closed position from among the plurality of positions.

8. The apparatus of claim 1, wherein the apparatus is to be coupled to a liquid cooling system, wherein the first end of the flexible tube is to be coupled to a first tube of the liquid cooling system and the first tube is to provide the heat transfer fluid into the apparatus, and wherein the second end of the flexible tube is to be coupled to a second tube of the liquid cooling system and the second tube is to receive the heat transfer fluid from the apparatus.

9. The apparatus of claim 1, wherein the apparatus is to be coupled to a cold plate associated with a component of a computer system, wherein the heat transfer fluid is to flow through the apparatus to cause the cold plate to reduce a temperature associated with the component.

10. The apparatus of claim 9, wherein the cold plate comprises a blade or tray that is insertable or detachable from a rack system associated with the computer system.

11. A method comprising:
    in response to a first current applied to a plurality of coil windings included in a valve, compressing a flexible tube included in the valve to a first state from among a plurality of states using a ring of ferromagnetic material that expands to a first volume in response to the first current applied to the plurality of coil windings, wherein the ring of ferromagnetic material is included in the valve and encircles at least an outside portion of a length of the flexible tube to cause the compression, and wherein a first amount of a heat transfer fluid is to flow through the flexible tube in accordance with the first state; and
    in response to a second current applied to the plurality of coil windings, compressing the flexible tube to a second state using the ring of ferromagnetic material that expands to a second volume in response to the second current applied to the plurality of coil windings, wherein a second amount of the heat transfer fluid is to flow through the flexible tube in accordance with the second state.

12. The method of claim 11, wherein compressing the flexible tube using the ring of ferromagnetic material, having the first volume, comprises:
    inducing a first magnetic field in response to the first current applied to the plurality of coil windings; and
    forming a volume of the ring of ferromagnetic material at the first volume in accordance with the first magnetic field.

13. The method of claim 11, wherein when the second current comprises a current less than the first current, the second state associated with the flexible tube comprises a more open state than the first state and the second volume associated with the ring of ferromagnetic material is less than the first volume.

14. The method of claim 11, wherein when the second current comprises a current greater than the first current, the second state associated with the flexible tube comprises a less open state than the first state and the second volume associated with the ring of ferromagnetic material is greater than the first volume.

15. The method of claim 14, wherein the second state comprises a fully closed state, and the first state comprises an open state between the fully closed state and a fully open state.

16. The method of claim 11, wherein when the second current comprises zero current, the second state associated with the flexible tube comprises a fully open state and the second volume associated with the ring of ferromagnetic material is less than the first volume.

17. The method of claim 11, wherein the plurality of states includes a fully open state, a fully closed state, and one or more states between the fully open and fully closed states.

18. An apparatus comprising:
a valve that includes a flexible tube having first and second ends to facilitate a heat transfer fluid to flow from the first end to the second end, ferromagnetic material encircling at least an outside portion of a length of the flexible tube, and a plurality of coil windings encircling the ferromagnetic material;
a first tube associated with a cooling system coupled to the first end of the flexible tube;
a second tube associated with a cold plate coupled to a component of a computer system to be cooled, the second tube coupled to the second end of the flexible tube; and
wherein the ferromagnetic material is to have a base volume, responsive to an absence of an application of a current to the plurality of coil windings or occurrence of an electrical short at the plurality of coil windings, to cause the flexible tube to be in a fully open position, and the ferromagnetic material is to have a selected one of a plurality of expanded volumes greater than the base volume, responsive to an application of a respective selected one of a plurality of currents to the plurality of coil windings, to cause the flexible tube to be in a respective selected one of a plurality of positions less open than the fully open position.

19. The apparatus of claim 18, wherein the flexible tube is to be compressed to reduce an amount of flow of the heat transfer fluid from the first end to the second end by expansion of the ferromagnetic material around the flexible tube, in response to the application of the respective selected one of the plurality of currents to the plurality of coil windings.

20. The apparatus of claim 18, wherein the ferromagnetic material is to have a largest expanded volume from among the plurality of expanded volumes, responsive to the application of the current to the plurality of coil windings, to cause the flexible tube to be in a fully closed position from among the plurality of positions.

21. The apparatus of claim 18, wherein the valve further includes a magnetic ring encircling the ferromagnetic material and disposed between the ferromagnetic material and the plurality of coil windings, wherein the magnetic ring is to generate a magnetic field in response to the application of the respective selected one of a plurality of currents, and the magnetic field is to induce expansion of the ferromagnetic material.

22. The apparatus of claim 18, wherein the valve further includes a flexible casing surrounding the ferromagnetic material, wherein the ferromagnetic material comprises a plurality of ferromagnetic particles suspended in a liquid, and wherein expansion of the ferromagnetic material comprises an expansion of a volume associated with the ferromagnetic material.

23. The apparatus of claim 18, wherein the ferromagnetic material comprises an electro active polymer (EAP) material that includes a plurality of ferromagnetic particles embedded in a polymer material.

24. An apparatus comprising:
means to facilitate heat transfer fluid flow from a first end to a second end;
means for volumetrically changing encircling at least an outside portion of a length of the means to facilitate heat transfer fluid flow; and
means for inducing a magnetic field encircling the means for volumetrically changing,
wherein the means to facilitate heat transfer fluid flow is to be compressed to reduce an amount of flow of the heat transfer fluid from the first end to the second end by expansion of the means for volumetrically changing around the means to facilitate heat transfer fluid flow, in response to an application of a current to the means for inducing a magnetic field.

25. The apparatus of claim 24, further comprising:
a magnetic means encircling the means for volumetrically changing and disposed between the means for volumetrically changing and the means for inducing the magnetic field,
wherein the magnetic means is to generate a magnetic field in response to the application of the current to the means for inducing the magnetic field, and the magnetic field is to induce the expansion of the means for volumetrically changing.

26. The apparatus of claim 24, wherein the means for volumetrically changing is to be unexpanded in response to an absence of the application of the current to the means for inducing the magnetic field, and the heat transfer fluid is to flow from the first end to the second end.

27. The apparatus of claim 24, wherein the means for volumetrically changing is to be unexpanded in response to an electrical short to the application of current to the means for inducing the magnetic field, and the heat transfer fluid is to flow from the first end to the second end.

28. The apparatus of claim 24, wherein the means for volumetrically changing is to have a base volume, responsive to an absence of the application of the current to the means for inducing the magnetic field or occurrence of an electrical short at the means for inducing the magnetic field, to cause the means to facilitate heat transfer fluid flow to be in a fully open position, and the means for volumetrically changing is to have a selected one of a plurality of expanded volumes greater than the base volume, responsive to an application of a respective selected one of a plurality of currents to the means for inducing the magnetic field, to cause the means to facilitate heat transfer fluid flow to be in a respective selected one of a plurality of positions less open than the fully open position.

* * * * *